United States Patent [19]
Kwon et al.

[11] Patent Number: 5,796,133
[45] Date of Patent: *Aug. 18, 1998

[54] SEMICONDUCTOR DEVICE CAPACITOR HAVING LOWER ELECTRODES SEPARATED BY LOW DIELECTRIC SPACER MATERIAL

[75] Inventors: Kee-Won Kwon, Suwon; Chang-Seok Kang, Seoul, both of Rep. of Korea

[73] Assignee: Samsung Electronics Co., Ltd., Kyungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 782,827

[22] Filed: Jan. 13, 1997

Related U.S. Application Data

[63] Continuation of Ser. No. 187,037, Jan. 27, 1994, abandoned.

[30] Foreign Application Priority Data

Jan. 27, 1993 [KR] Rep. of Korea ............... 1993 963

[51] Int. Cl.$^6$ ........................................... H01L 27/108
[52] U.S. Cl. .......................... 257/295; 257/296; 257/306; 257/310; 438/2; 438/3; 438/240; 438/396
[58] Field of Search .......................... 257/295, 296, 257/306, 310; 361/313; 437/52; 438/2, 3, 240, 396

[56] References Cited

U.S. PATENT DOCUMENTS

| 5,198,384 | 3/1993 | Dennison | 437/47 |
| 5,206,788 | 4/1993 | Larsen et al. | 257/295 |
| 5,439,840 | 8/1995 | Jones, Jr. et al. | 437/52 |
| 5,543,644 | 8/1996 | Abt et al. | 257/295 |

FOREIGN PATENT DOCUMENTS

| 4206870 | 7/1992 | Japan | 257/295 |

*Primary Examiner*—Valencia Wallace
*Attorney, Agent, or Firm*—Cushman Darby&Cushman IP Group of Pillsbury Madison & Sutro LLP

[57] ABSTRACT

In a semiconductor device having a ferroelectric capacitor and manufacturing method thereof, a spacer comprising a low dielectric material is formed on the side surfaces of a plurality of lower electrodes separated into each cell unit, and a ferroelectric film is formed on the lower electrodes whereon the low dielectric material spacer is formed, and an upper electrode is formed on the ferroelectric film, to thereby prevent an error which may be caused between the adjacent lower electrodes.

16 Claims, 6 Drawing Sheets

SEMICONDUCTOR DEVICE CAPACITOR HAVING LOWER ELECTRODES SEPARATED BY LOW DIELECTRIC SPACER MATERIAL

This is a continuation of application Ser. No. 08/187,037, filed Jan. 27, 1994, which was now abandoned.

BACKGROUND OF THE INVENTION

The present invention relates to a semiconductor device and a method for manufacturing the same, and more particularly, to a semiconductor device and a method for manufacturing the same which uses a ferroelectric film as the dielectric film of a capacitor.

The integration of dynamic random access memory (DRAM) devices has been increasing in recent years, and many methods for increasing capacitance within a limited cell area have been proposed. These methods can be largely divided into two groups: one in which the physical structural characteristics of the capacitor are improved, and another in which the capacitor comprises a material having a high dielectric constant.

Where the capacitor structure has been improved, the effective area of the capacitor has been increased by forming a three-dimensional storage electrode. Here, however, design rule limitations and complicated manufacturing processes impede the increase of capacitance.

On the other hand, where a material having a high dielectric constant is used as the dielectric film of the capacitor, capacitance is not limited by design rule and can be increased more easily.

Recently, it has been proposed to use a ferroelectric material as the dielectric film. Unlike the previously existing oxide, silicon nitride or tantalum pentoxide ($Ta_2O_5$) films, a ferroelectric material is a material which exhibits spontaneous polarization, and generally has a high dielectric constant of at least 1,000. When the ferroelectric material is used as the dielectric film, the thickness of an equivalent oxide film can be reduced, for example, to 10 Å or less, even though the ferroelectric material is formed to a thickness of only several thousand angstroms. Furthermore, due to the spontaneous polarization phenomenon, a dielectric film comprising a ferroelectric material can be used for nonvolatile memory devices as well as for DRAMs.

In addition, PZT ($PbZrTiO_3$), BST ($BaSrTiO_3$) and the like have high dielectric constants and ferroelectric characteristics that differ according to their composite ratio. Therefore, these materials have recently been popular as dielectric materials for DRAM capacitors. When such materials are used for the dielectric film, platinum is used for the electrode of the capacitor due to its great resistance to oxidation.

FIG. 1 is a sectional view of a semiconductor device having a ferroelectric film capacitor manufactured by a conventional method.

In FIG. 1, a transistor pair is formed in the active region defined by field oxide film 10 of a semiconductor substrate 100. The transistors share a drain region 7, and each comprise a source region 5 and a gate electrode 15. A bit line 20 is connected to drain region 7, and contact holes for exposing predetermined portions of each source region 5 are formed thereabove.

Each contact hole is filled with a conductive plug 25 and the capacitors' lower electrodes, each consisting of a titanium layer 30 and platinum layer 35, are formed on each plug. A ferroelectric thin film 40 is formed over the lower electrodes, and an upper electrode 50 is formed on ferroelectric thin film 40.

In a capacitor manufactured according to the conventional method described above, the film can be weakened at the sharp edges of the lower electrode (e.g., see area "B" of FIG. 1) when the ferroelectric film is formed after lower electrode formation. In addition, because the dielectric constant of a ferroelectric film is very large, roughly from 1,000 to 10,000, there is a high possibility that errors will occur between the adjacent capacitors through the ferroelectric film disposed between the adjacent lower electrodes (see area "A" of FIG. 1).

In 1991, Kuniaki Koyama et al. disclosed a new method for manufacturing a capacitor in order to solve the problems described above (see IEDM '91, "A Stacked Capacitor with ($Ba_xSr_{1-x}$)$TiO_3$ for 256M DRAMs"). FIGS. 2A to 2E are sectional views that illustrate a method for manufacturing this capacitor.

Referring to FIG. 2A, an insulating layer 102 is formed on semiconductor substrate 100, and a contact hole 105 is formed by etching a predetermined portion of insulating layer 102. Then, impurity-doped polysilicon is deposited over the entire resultant structure, and fills contact hole 105. The structure is subsequently etched back in a manner which allows contact hole 105 to remain filled with polysilicon 110.

Referring to FIG. 2B, a tantalum layer and a platinum layer are sequentially sputtered on the resultant structure, each to a thickness of 500 Å. Both layers are then patterned by a dry-etching process to form a platinum pattern 125 and a tantalum pattern 120, which constitute a lower electrode.

Referring to FIG. 2C, ($Ba_{0.5}Sr_{0.5}$)$TiO_3$ is deposited over the entire resultant structure by RF magnetron sputtering, to thereby form a ferroelectric film 130 having a thickness of 700–2,000 Å.

Referring to FIG. 2D, a chemical vapor deposition (CVD) oxide film having a thickness of 1,000 Å is formed over the entire resultant structure. The structure is subsequently etched anisotropically, to thereby form a spacer 135 which reduces leakage current caused by the poor step coverage of ferroelectric film 130.

Referring to FIG. 2E, a titanium nitride (TiN) layer 140 forms an upper electrode having a thickness of 1,000 Å and is deposited across the entire resultant structure.

A capacitor manufactured by the above method forms a CVD oxide film spacer whose breakdown resistance is excellent even at the weak portions of the ferroelectric film, and thus has a very low leakage current and a stable breakdown resistance distribution.

However, due to the very high dielectric constant of the ferroelectric film, the possibility that an error will be caused between the adjacent capacitors still remains.

SUMMARY OF THE INVENTION

Accordingly, it is a first object of the present invention to provide a reliable semiconductor device having a spacer consisting of a low dielectric material between the adjacent capacitors. It is a second object of the present invention to provide a method especially suited for manufacturing the above described reliable semiconductor device.

To accomplish the first object of the present invention, there is provided a semiconductor device having a capacitor with a spacer formed on the side surfaces of plural lower electrodes. The spacer comprises a material with a low dielectric constant. A ferroelectric film is formed on the lower electrodes, and an upper electrode is formed on the ferroelectric film.

To accomplish the second object of the present invention, there is provided a method for manufacturing a semiconductor device having a capacitor, comprising the steps of: forming a plurality of lower electrodes from a conductive material; forming a spacer comprising a material with a low dielectric constant on the side surfaces of each lower electrode; forming a ferroelectric film over at least the spacer and lower electrodes; and forming an upper electrode on the ferroelectric film.

To accomplish another object of the present invention, there is provided a method for manufacturing a semiconductor device having a capacitor, comprising the steps of: forming a plurality of lower electrodes from a conductive material; providing a material having a low dielectric constant between the lower electrodes; forming a ferroelectric film over at least the lower electrodes and said material having a low dielectric constant; and forming an upper electrode on the ferroelectric film.

Accordingly, a spacer having a low dielectric constant is formed between each lower electrode, to thereby prevent the occurrence of errors between the adjacent capacitors.

BRIEF DESCRIPTION OF THE DRAWINGS

The above objects and other advantages of the present invention will become more apparent in view of the following description of a preferred embodiment with reference to the attached drawings in which.

DETAILED DESCRIPTION OF THE INVENTION

The present invention will be explained in more detail with reference to the attached drawings.

FIGS. 3 to 6 are sectional views for illustrating a method for manufacturing a semiconductor device comprising a ferroelectric film capacitor according to a first embodiment of the present invention.

Figure 1:
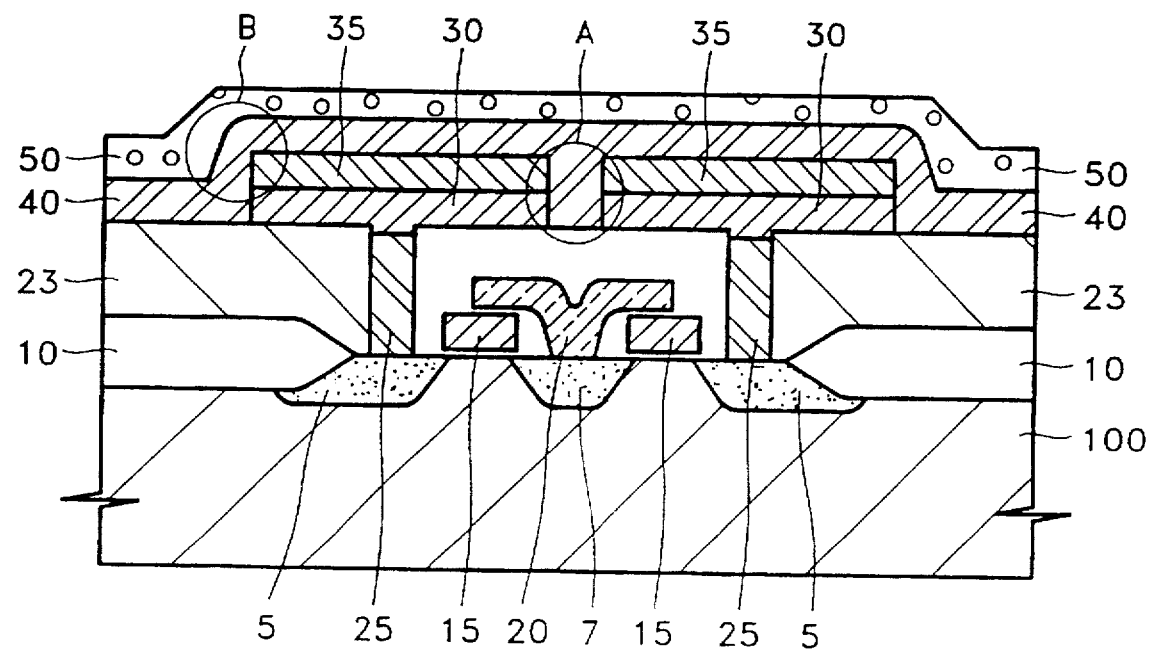
FIG. 1 is a sectional view showing a semiconductor device comprising a ferroelectric film capacitor manufactured by a conventional method.
Figure 2A:
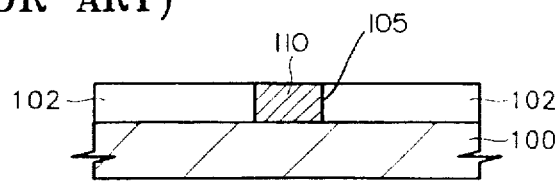
FIGS. 2A to 2E are sectional views for illustrating a ferroelectric film capacitor manufactured by another conventional method.
Figure 2B:
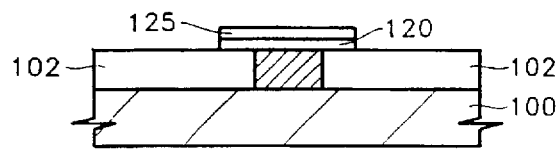
Figure 2C:
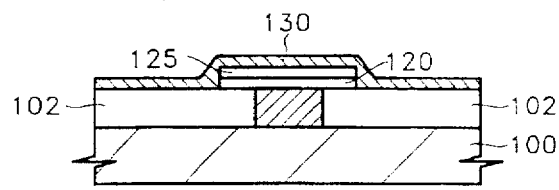
Figure 2D:
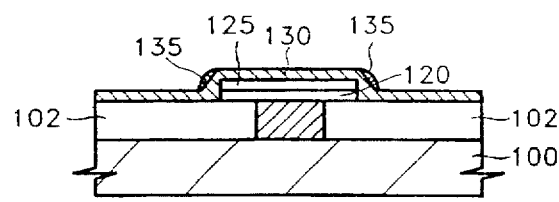
Figure 2E:
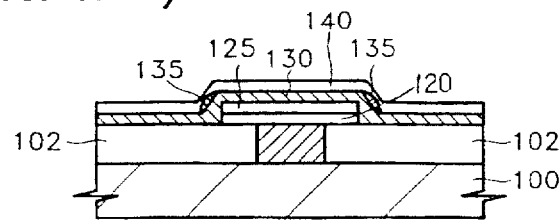
Figure 3:
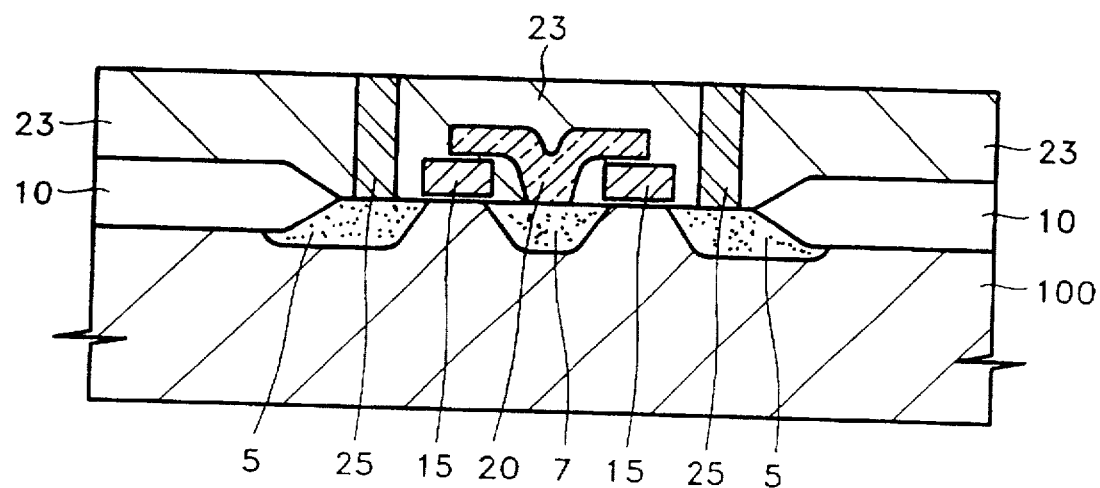
FIGS. 3 to 6 are sectional views for illustrating a method for manufacturing a semiconductor device comprising a ferroelectric film capacitor according to a first embodiment of the present invention.

FIG. 3 shows the step of forming a contact hole and a conductive plug 25 on a semiconductor substrate 100 whereon a transistor pair is formed. Semiconductor substrate 100 has an isolation region and an active region as defined by field oxide film 10. A pair of transistors each have a source region 5, a gate electrode 15, and share a drain region 7 and a bit line 20 connected to the drain region. The transistors are formed on the active region of semiconductor substrate 100. Then, an insulating layer (not shown) is formed over the entire substrate 100. A planarization layer 23 is then formed over the entire resultant structure in order to planarize the uneven surface of substrate 100 created by the formation of the transistors and bit line. Then, planarization layer 23 and the insulating layer, are selectively etched at an area above the source regions 5 to form contact holes for connecting the source regions to lower electrodes. Then, as a conductive material, phosphorous-doped polysilicon is deposited on substrate 100 at least where the contact hole is formed, and then etched back so that the contact hole is filled with a conductive plug 25.

Figure 4:
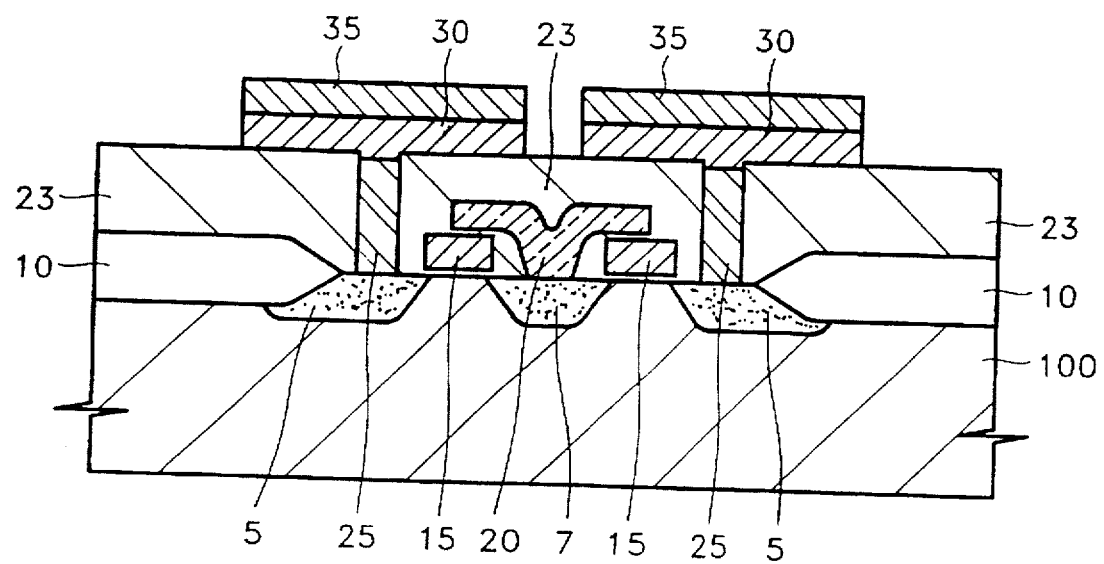

FIG. 4 shows the step of forming the lower electrodes of the capacitor. A titanium layer having a thickness of approximately 500 Å and a platinum layer having a thickness of 1.000 Å are sequentially formed by sputtering these substances over the entire resultant structure, including conductive plug 25. Then, a photoresist pattern (not shown) is formed on the platinum layer (upper layer) by coating, exposing and developing the photoresist so as to define each cell. Then, both layers are simultaneously etched using the photoresist pattern as a mask, to thereby form the capacitor's lower electrode which consists of platinum pattern 35 and titanium pattern 30. Then, the first photoresist pattern is removed. Here, tantalum can be used instead of titanium in the lower electrode.

Figure 5:
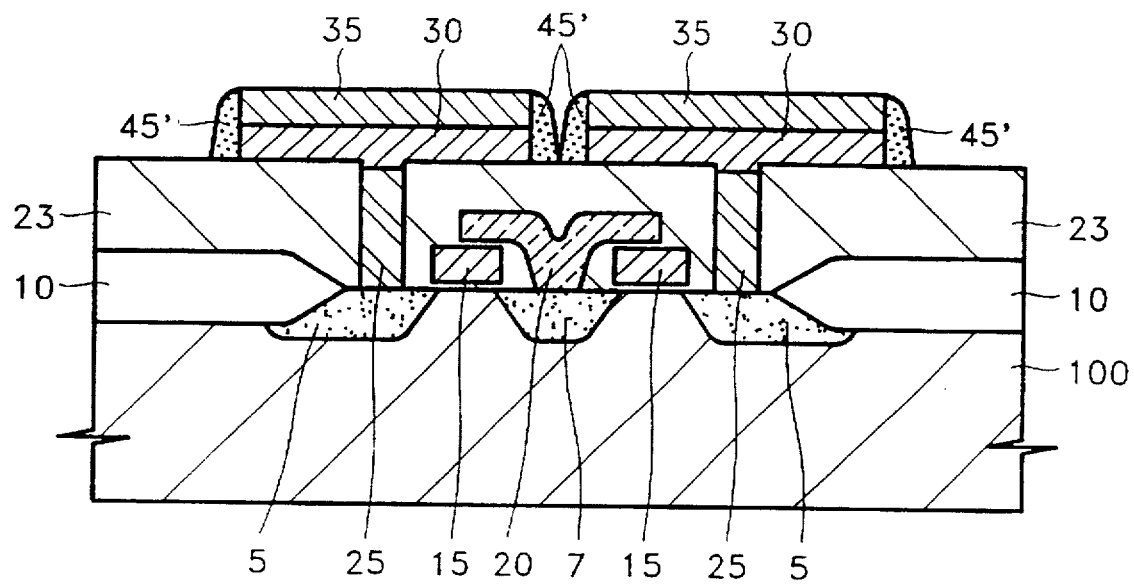

FIG. 5 shows the step of forming a first spacer 45'. A material having a low dielectric constant, such as plasma-enhanced $SiO_2$ (PE—$SiO_2$), a CVD oxide film, silicon nitride ($Si_xN_y$), boro-nitride (BN), boro-phosphorous silicate glass (BPSG), phosphorous silicate glass (PSG), undoped silicate glass (USG) or boro-silicate glass (BSG) is deposited to a thickness of 1.500 Å to 2.000 Å on the resultant structure of FIG. 4. Then, the low dielectric material is etched anisotropically to form first spacer 45' on the side surfaces of the lower electrode.

Figure 6:
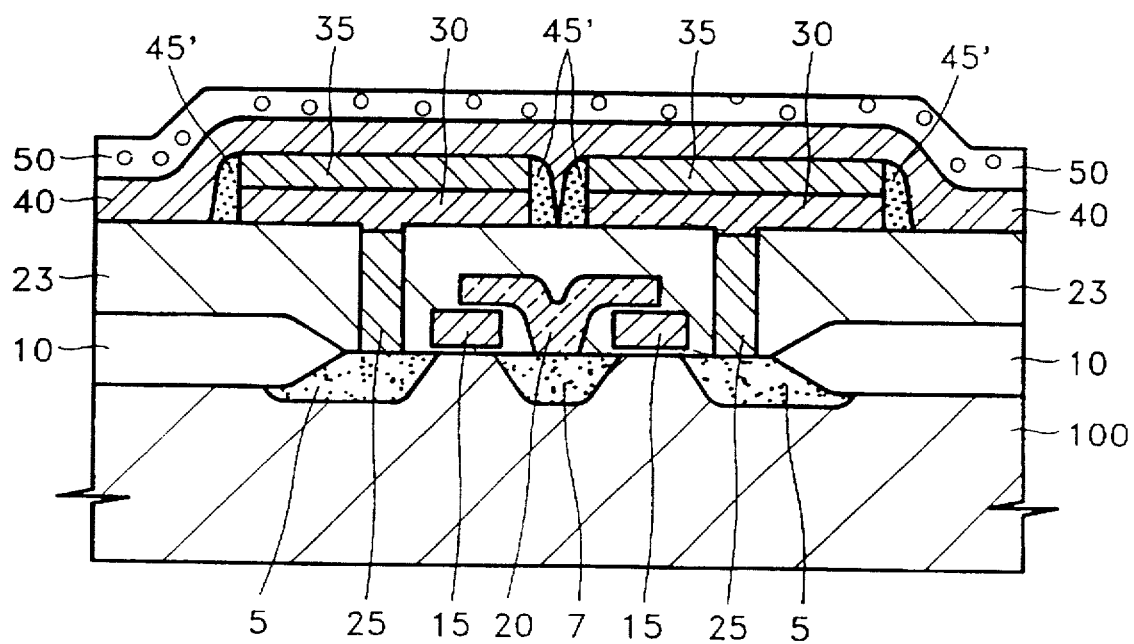

FIG. 6 shows the step of forming a ferroelectric film 40 and an upper electrode 50. The ferroelectric material may comprise PZT, $PbTiO_3$ (PLT), $PbLaZrTiO_3$ (PLZT), $SrTiO_3$ (STO), BST or $LiNbO_3$ (LNO), and is deposited by a CVD method on the resultant structure of FIG. 5. As a result, ferroelectric film 40 is formed. Then, as a conductive material, platinum, TiN or aluminum is deposited on ferroelectric film 40 to form the capacitor's upper electrode.

Figure 7:
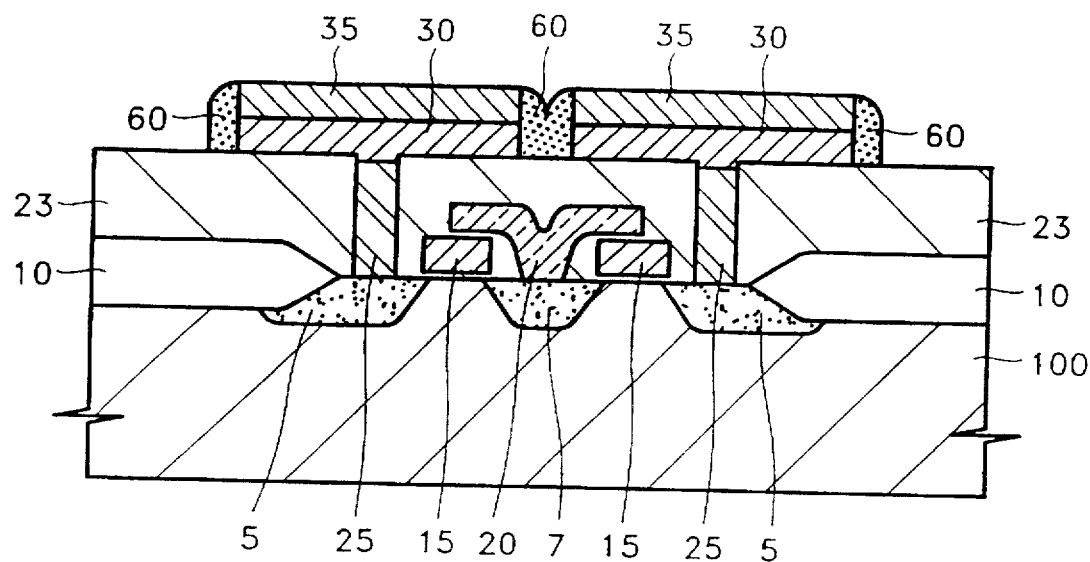
FIGS. 7 to 8 are sectional views for illustrating a method for manufacturing a semiconductor device comprising a ferroelectric film capacitor according to a second embodiment of the present invention.
Figure 8:
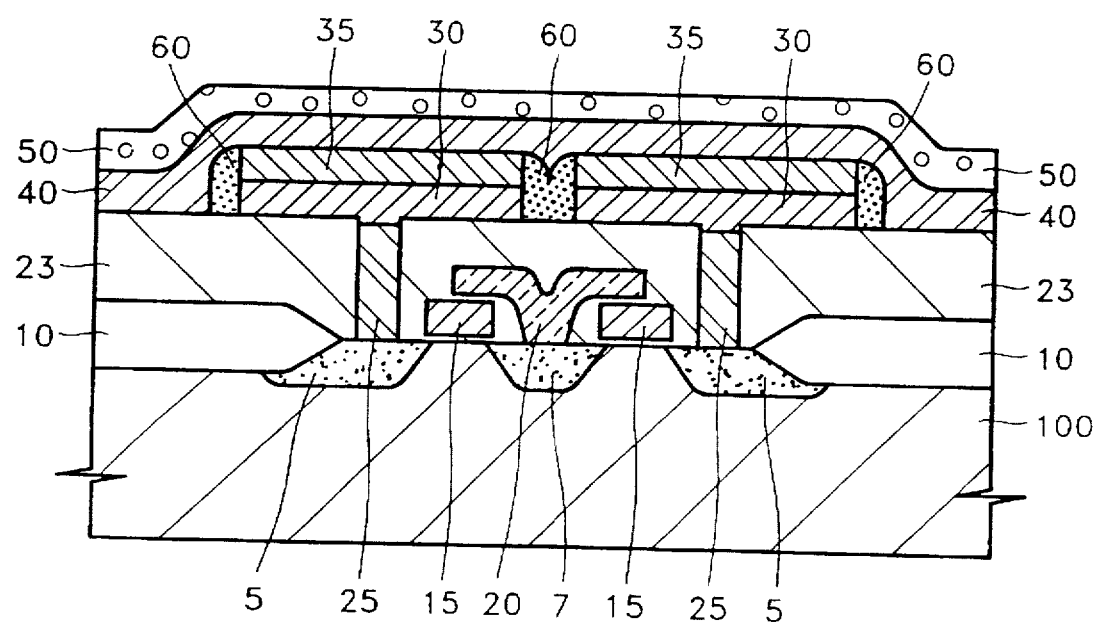

FIGS. 7 to 8 are sectional views for illustrating a method for manufacturing a semiconductor device comprising a ferroelectric film capacitor according to a second embodiment of the present invention.

FIG. 7 shows the step of forming the lower electrodes of the capacitor and a second spacer 60. After forming the lower electrodes using the method explained with respect to FIGS. 3 and 4, a low dielectric material consisting of BN, BPSG, BSG or $SiO_2$ is deposited to a thickness of approximately 2.000 Å to 10.000 Å over the resultant structure. Then, the low dielectric material is etched anisotropically so that second spacer 60 is formed on the side surface of the lower electrodes, which consist of platinum pattern 30 and titanium pattern 35. Second spacers 60 fills the space between the adjacent lower electrodes more than the spacers in the first embodiment.

FIG. 8 shows the step of sequentially forming ferroelectric film 40 and upper electrode 50 on lower electrodes having side surfaces provided with second spacer 60 using the method explained with respect to FIG. 7.

Figure 9:
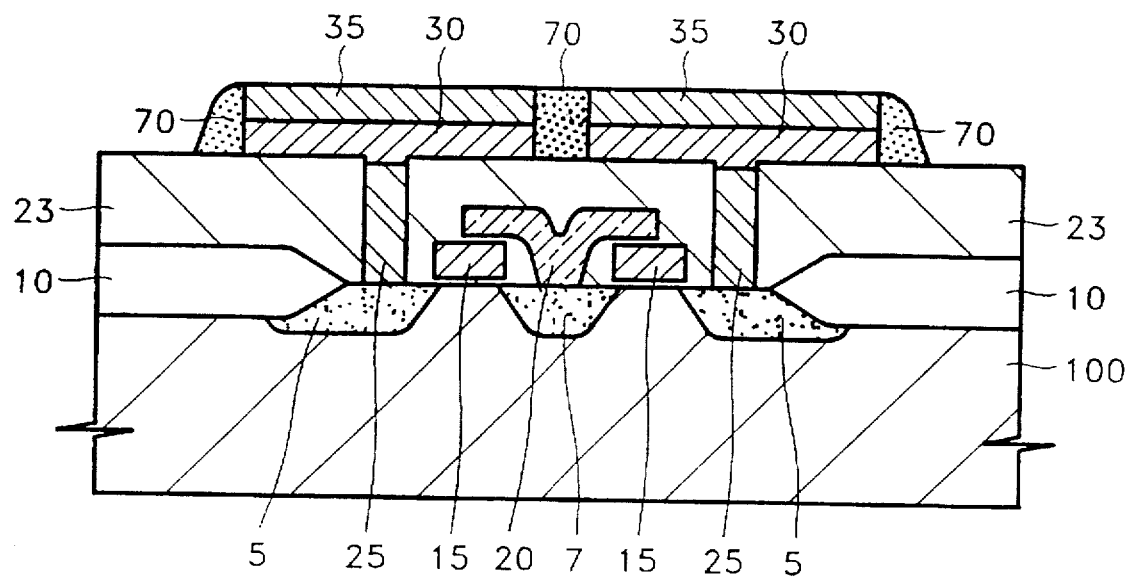
FIGS. 9 to 10 are sectional views for illustrating a method for manufacturing a semiconductor device comprising a ferroelectric film capacitor according to a third embodiment of the present invention.
Figure 10:
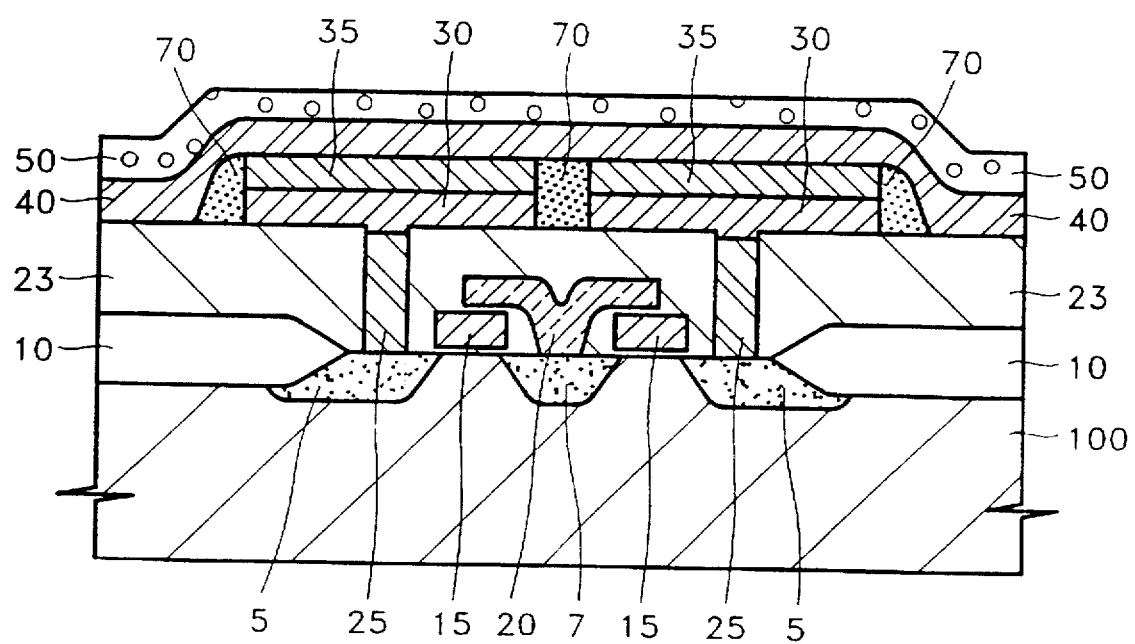

FIGS. 9 and 10 are sectional views for illustrating a method for manufacturing for a semiconductor device which comprises a ferroelectric film capacitor according to a third embodiment of the present invention.

FIG. 9 shows the step of forming the lower electrodes and a third spacer 70. After forming the lower electrodes using the method explained with respect to FIGS. 3 and 4, a low dielectric material such as BPSG, PSG or BSG is deposited to a thickness of approximately 2,000 Å to 10,000 Å over the entire resultant structure. Then, the low dielectric material is planarized by a high-temperature heat treatment process, and the resultant structure is etched anisotropically so that third spacer 70 is formed on the side surfaces of the lower electrode consists of platinum pattern 35 and titanium pattern 30. Third spacer 70 completely fills up the space between the adjacent lower electrodes so that the lower electrodes of each cell can be separated by a planarized surface.

FIG. 10 shows the step of then sequentially forming ferroelectric film 40 and upper electrode 50 on the lower electrodes using the method explained with respect to FIG. 6.

As described above, and according to embodiments of the present invention, a spacer comprising a low dielectric material is formed on the side surfaces of a capacitor's lower electrode so that errors which may be caused between the adjacent lower electrodes are prevented. In addition, the sharp edges of the lower electrodes are somewhat more rounded by the spacers, and as a result, the possibility that the ferroelectric film may be weakened in this area is reduced.

In addition, in all the above embodiments, since a spacer consisting of the low dielectric material is formed by a simple anisotropic etching process without the use of any additional masking, the problems associated with the prior art can be easily solved without added processing problems and without increasing production costs.

It is understood by those skilled in the art that the foregoing description is a preferred embodiment of the disclosed device and that various changes and modifications may be made in the invention without departing from the spirit and scope thereof.

What is claimed is:

1. A semiconductor device having a capacitor, said semiconductor device comprising:

a plurality of lower electrodes each having side surfaces;

a spacer formed on each of the side surfaces of said lower electrodes, said spacer comprising a material having a low dielectric constant, and at least two of said spacers and corresponding lower electrodes forming rounded edges, the height of said spacers not exceeding the height of said lower electrodes;

a ferroelectric film formed over said plurality of lower electrodes and over said spacers, including over said rounded edges; and an upper electrode formed over said ferroelectric film including the film formed over said rounded edges.

2. A semiconductor device according to claim 1, wherein said spacer comprises a material selected from the group comprising PE—$SiO_2$, CVD oxide, $Si_xN_y$, BN, BPSG, PSG, USG and BSG.

3. A semiconductor device according to claim 1, wherein at least one space is formed between said electrodes, and wherein said material having a low dielectric constant fills said at least one space.

4. A semiconductor device according to claim 2, wherein at least one space is formed between said lower electrodes, and wherein said material having a low dielectric constant fills said at least one space.

5. The semiconductor device according to claim 1, wherein said ferroelectric film is formed on said plurality of lower electrodes, and further wherein said ferroelectric film is formed on said spacer.

6. The semiconductor device according to claim 1, wherein said upper electrode is formed on said ferroelectric film.

7. The semiconductor device according to claim 5, wherein said upper electrode is formed on said ferroelectric film.

8. The semiconductor device according to claim 1, further comprising:

a semiconductor substrate having an active region and a pair of transistors formed in said active region, said pair of transistors comprising a common drain region, gate regions and source regions;

a bit line connected to said common drain region; and means for forming a conductive path between said lower electrodes and respective ones of said source regions;

and a planarization layer formed over said semiconductor substrate;

said plurality of lower electrodes being formed over said planarization layer.

9. A semiconductor device having a capacitor, said semiconductor device comprising:

at least two lower electrodes arranged to form a space therebetween, said electrodes including respective inner side surfaces, forming respective opposing sides of said space, and respective outer side surfaces;

a spacer material formed on each of said respective inner and outer side surfaces and at least partially filling said space, said spacer material having a low dielectric constant, and at least two of said spacers and corresponding lower electrodes forming rounded edges, the height of said spacers not exceeding the height of said lower electrodes;

a ferroelectric film formed over said at least two lower electrodes and over said spacer material, including over said rounded edges; and at least one upper electrode formed over said ferroelectric film including the film formed over said rounded edges.

10. The semiconductor device according to claim 9, wherein said spacer material comprises a material selected from the group comprising PE—$SiO_2$, CVD oxide, $Si_xN_y$, BN, BPSG, PSG, USG and BSG.

11. The semiconductor device according to claim 9, wherein said semiconductor device comprises a dynamic random access memory device.

12. The semiconductor device according to claim 9, wherein said ferroelectric film has a dielectric constant of at least 1,000.

13. The semiconductor device according to claim 9, wherein said ferroelectric film comprises a material selected from the group comprising PZT, $PbTiO_3$ (PLT), $PbLaZrTiO_3$ (PLZT), $SrTiO_3$ (STO), BST, $LiNbO_3$ (LNO).

14. The semiconductor device according to claim 9, further comprising:

a semiconductor substrate having an active region and a pair of transistors formed in said active region, said pair of transistors comprising a common drain region, gate regions and source regions;

a bit line connected to said common drain region; and means for forming a conductive path between said lower electrodes and respective ones of said source regions;

and a planarization layer formed over said semiconductor substrate;

said plurality of lower electrodes being formed over said planarization layer.

15. The semiconductor device according to claim 1, wherein said rounded edges reduce the possibility that portions of said ferroelectric film over said rounded edges are weakened relative to other portions of said ferroelectric film.

16. The semiconductor device according to claim 9, wherein said rounded edges reduce the possibility that portions of said ferroelectric film over said rounded edges are weakened relative to other portions of said ferroelectric film.

* * * * *